(12) United States Patent
Yokouchi et al.

(10) Patent No.: US 8,186,053 B2
(45) Date of Patent: *May 29, 2012

(54) CIRCUIT BOARD AND METHOD OF MANUFACTURING THE SAME

(75) Inventors: Kishio Yokouchi, Kawasaki (JP); Hideaki Yoshimura, Kawasaki (JP); Katsuya Fukase, Nagano (JP)

(73) Assignees: Fujitsu Limited, Kawasaki (JP); Shinko Electric Industries Co., Ltd., Naganoshi, Nagano (JP)

( * ) Notice: Subject to any disclaimer, the term of this patent is extended or adjusted under 35 U.S.C. 154(b) by 735 days.

This patent is subject to a terminal disclaimer.

(21) Appl. No.: 12/271,519

(22) Filed: Nov. 14, 2008

(65) Prior Publication Data

US 2010/0122843 A1 May 20, 2010

(51) Int. Cl.
*H01K 3/10* (2006.01)
*B22F 7/00* (2006.01)

(52) U.S. Cl. .............. 29/852; 29/830; 29/831; 29/832; 29/846; 29/847; 428/549

(58) Field of Classification Search ................ 29/852, 29/830, 831, 832, 846, 847; 428/549, 567, 428/608, 611, 209; 438/27, 65; 257/98, 257/116; 174/110 D, 266, 68.5, 256
See application file for complete search history.

(56) References Cited

U.S. PATENT DOCUMENTS

| | | | |
|---|---|---|---|
| 4,318,954 A * | 3/1982 | Jensen | 174/255 |
| 4,791,248 A * | 12/1988 | Oldenettel | 174/265 |
| 5,707,893 A * | 1/1998 | Bhatt et al. | 216/18 |
| 6,869,664 B2 | 3/2005 | Vasoya et al. | |
| 7,038,142 B2 | 5/2006 | Abe | |
| 7,224,046 B2 | 5/2007 | Abe et al. | |
| 2003/0136577 A1 | 7/2003 | Abe | |
| 2005/0218503 A1 | 10/2005 | Abe et al. | |
| 2006/0244134 A1 | 11/2006 | Inagaki et al. | |
| 2007/0256858 A1 | 11/2007 | Kariya et al. | |

(Continued)

FOREIGN PATENT DOCUMENTS

JP 2-227220 A 9/1990

(Continued)

OTHER PUBLICATIONS

Korean Office Action dated Sep. 28, 2010, issued in corresponding Korean Patent Application No. 10-2008-0114312.

(Continued)

*Primary Examiner* — Derris Banks
*Assistant Examiner* — Tai Nguyen
(74) *Attorney, Agent, or Firm* — Westerman, Hattori, Daniels & Adrian, LLP

(57) ABSTRACT

A circuit board has plated through holes which are laid out with a fine pitch and meets requirements relating to characteristics such as strength and thermal expansion coefficient. A method of manufacturing a circuit board includes: a step of forming a core portion by thermal compression bonding prepregs formed by disposing carbon fibers so as to produce openings at positions where plated through holes will pass through and impregnating the carbon fibers with resin; a step of forming through holes that pass inside the openings at positions of the openings in the core portion; and a step of forming a conductive layer on inner surfaces of the through holes to form plated through holes at positions that do not interfere with the carbon fibers and thereby produce a core substrate.

5 Claims, 4 Drawing Sheets

U.S. PATENT DOCUMENTS

| | | |
|---|---|---|
| 2007/0281394 A1 | 12/2007 | Kawabe et al. |
| 2008/0083560 A1 | 4/2008 | Saiki et al. |

FOREIGN PATENT DOCUMENTS

| | | |
|---|---|---|
| JP | 06-177547 A | 6/1994 |
| JP | 2002-004165 A | 1/2002 |
| JP | 2002-013040 A | 1/2002 |
| JP | 2003-218287 A | 7/2003 |
| JP | 2004-119691 A | 4/2004 |
| JP | 2004-515610 A | 5/2004 |
| JP | 2005-187301 A | 7/2005 |
| JP | 2007-103605 A | 4/2007 |
| JP | 2008-53362 A | 3/2008 |
| JP | 2008-85106 A | 4/2008 |
| TW | I246369 | 12/2005 |
| WO | 00-18202 A1 | 3/2000 |
| WO | 02/47899 A1 | 6/2002 |
| WO | 2004/064467 A1 | 7/2004 |

OTHER PUBLICATIONS

Taiwanese Office Action dated Nov. 25, 2011, issued in corresponding Taiwan Patent Application No. 097144345 with concise explanation of relevance in Dec. 21, 2011 letter from Saint Island Law Office.

Japanese Office Action dated Nov. 29, 2011, issued in corresponding Japanese Patent Application No. 2007-265989 w/English Translation.

Analysis Letter of Dec. 21, 2011 from Saint Island Law Office to T. Watanuki for Taiwanese Office Action dated Nov. 25, 2011, issued in corresponding Taiwan Patent Application No. 097144345.

* cited by examiner

CIRCUIT BOARD AND METHOD OF MANUFACTURING THE SAME

BACKGROUND OF THE INVENTION

1. Field of the Invention

The present invention relates to a circuit board and a method of manufacturing the same, and in more detail to a circuit board with a core substrate, a method of manufacturing the same, a semiconductor device that uses a circuit board, and a prepreg used in a circuit board.

2. Related Art

Circuit boards used to mount semiconductor elements include boards with a core substrate made of carbon fiber reinforced plastic (CFRP). A core substrate made of CFRP has a low thermal expansion coefficient compared to a conventional core substrate made of a glass epoxy substrate. A circuit board that uses a CFRP core substrate can be manufactured so that the thermal expansion coefficient matches the thermal expansion coefficient of a semiconductor element, which is effective in avoiding thermal stress that is produced between the semiconductor element and the circuit board.

A circuit board is formed by laminating wiring layers on both surfaces of the core substrate and forming PTH (Plated Through Holes) to conduct electricity between the wiring layers laminated on both surfaces of the core substrate. These PTH are formed by forming through holes in the substrate and then carrying out plating to form conductive parts (a plated layer) on the inner wall surfaces of the through holes.

However, for a core substrate with a core portion of a material like CFRP that conducts electricity, if through holes are simply formed in the substrate and the inner wall surfaces of such through holes are plated, electrical shorting will occur between the PTH and the core portion. For this reason, when forming PTH in a core substrate with a core portion that conducts electricity, preliminary holes are formed through the core substrate with a larger diameter than the PTH, the preliminary holes are filled with an insulating resin, and then the PTH are formed inside the preliminary holes to prevent shorting between the PTH and the core portion (see Patent Documents 1, 2).

Patent Document 1
　Japanese Laid-Open Patent Publication No. 2003-218287
Patent Document 2
　Japanese Domestic Republication No. 2004/064467

SUMMARY OF THE INVENTION

However, with a layout where preliminary holes are formed in the core substrate and the PTH are formed so as to pass through the preliminary holes, since the preliminary holes have a larger diameter than the PTH, compared to a construction where PTH are simply formed in the core substrate, there is an increase in the layout spacing between the PTH, which limits the density with which the PTH can be formed.

Also, if the preliminary holes are filled with an insulating resin, there is an effect whereby the thermal expansion coefficient of the core substrate is increased, and for a circuit board equipped with a core portion made of carbon fiber, this reduces the advantage of having the core substrate formed with a low thermal expansion coefficient.

The present invention was conceived to solve the problems described above and it is an object of the present invention to provide a circuit board where the plated through holes formed in the circuit board can be laid out with a fine pitch and where the core substrate can meet requirements relating to strength and the thermal expansion coefficient, a method of manufacturing the same, a semiconductor device, and a prepreg used in a circuit board.

To achieve the stated object, a method of manufacturing a circuit board according to the present invention includes: a step of forming a core portion by thermal compression bonding prepregs formed by disposing fibers so as to produce openings at positions where plated through holes (hereinafter "PTH") will pass through and impregnating the fibers with resin; a step of forming through holes that pass inside the openings at positions of the openings in the core portion; and a step of forming a conductive layer on inner surfaces of the through holes to form PTH at positions that do not interfere with the fibers and thereby produce a core substrate.

In the step of forming the core portion, the fibers may be formed as a carbon fiber woven material and prepregs where openings through which the PTH will pass are formed in the carbon fiber woven material may be used. Alternatively, in the step of forming the core portion, the fibers may be formed as a woven material that is a composite of carbon fibers and non-conductive fibers and prepregs where openings through which the PTH will pass are formed in the woven material may be used. By doing so, it is possible to manufacture a circuit board where electrical shorting between the core portion, which is conductive, and the PTH is avoided.

A circuit board according to the present invention includes: a core substrate; wiring layers provided so as to be laminated on both surfaces of the core substrate; and PTH that are provided in the core substrate and electrically connect the wiring layers, wherein a core portion that constructs the core substrate is formed by thermal compression bonding prepregs formed by impregnating fibers with resin and the PTH are provided so as to not interfere with the fibers of the core portion. It is also possible to use such circuit board as an interposer.

The fibers are favorably formed as carbon fiber woven material and openings through which the PTH will pass may be formed in the carbon fiber woven material.

It is also effective for the fibers to be formed as a woven material that is a composite of carbon fibers and non-conductive fibers and for openings through which the PTH will pass to be formed in the woven material.

It is also possible to provide a semiconductor device by mounting a semiconductor element on the circuit board described above.

A prepreg according to the present invention is used to form a core portion of a core substrate of a circuit board and includes fibers with a lower thermal expansion coefficient than copper, wherein the fibers are provided at positions that do not interfere with PTH to be formed in the core substrate.

The fibers may be formed as carbon fiber woven material and openings through which the PTH will pass may be formed in the carbon fiber woven material. Such prepreg is effective in avoiding electrical shorting between the PTH and the core substrate and has a low thermal expansion coefficient. It is also favorable to form the fibers as a woven material that is a composite of carbon fibers and non-conductive fibers and to form openings through which the PTH will pass in the woven material.

According to the circuit board and the method of manufacturing according to the present invention, the fibers included in a prepreg that forms the core portion of a core substrate are disposed so as to not interfere with the positions at which PTH pass through the core substrate, which makes it possible to form the PTH without interfering the layout of fibers in the prepreg and to layout the PTH with a fine pitch. By appropriately selecting the fibers included in the prepreg, it is possible to provide the core substrate with required characteristics such as strength.

DESCRIPTION OF THE PREFERRED EMBODIMENTS

Method of Manufacturing a Circuit Board

One embodiment of a method of manufacturing a circuit board according to the present invention will now be described.

In the method of manufacturing a circuit board according to the present embodiment, a core substrate with a core portion made of carbon fiber reinforced plastic (CFRP) is used.

FIGS. 1A to 1F show the manufacturing steps up to the formation of a core substrate 20 with a core portion 10 made of CFRP.

Figure 1:
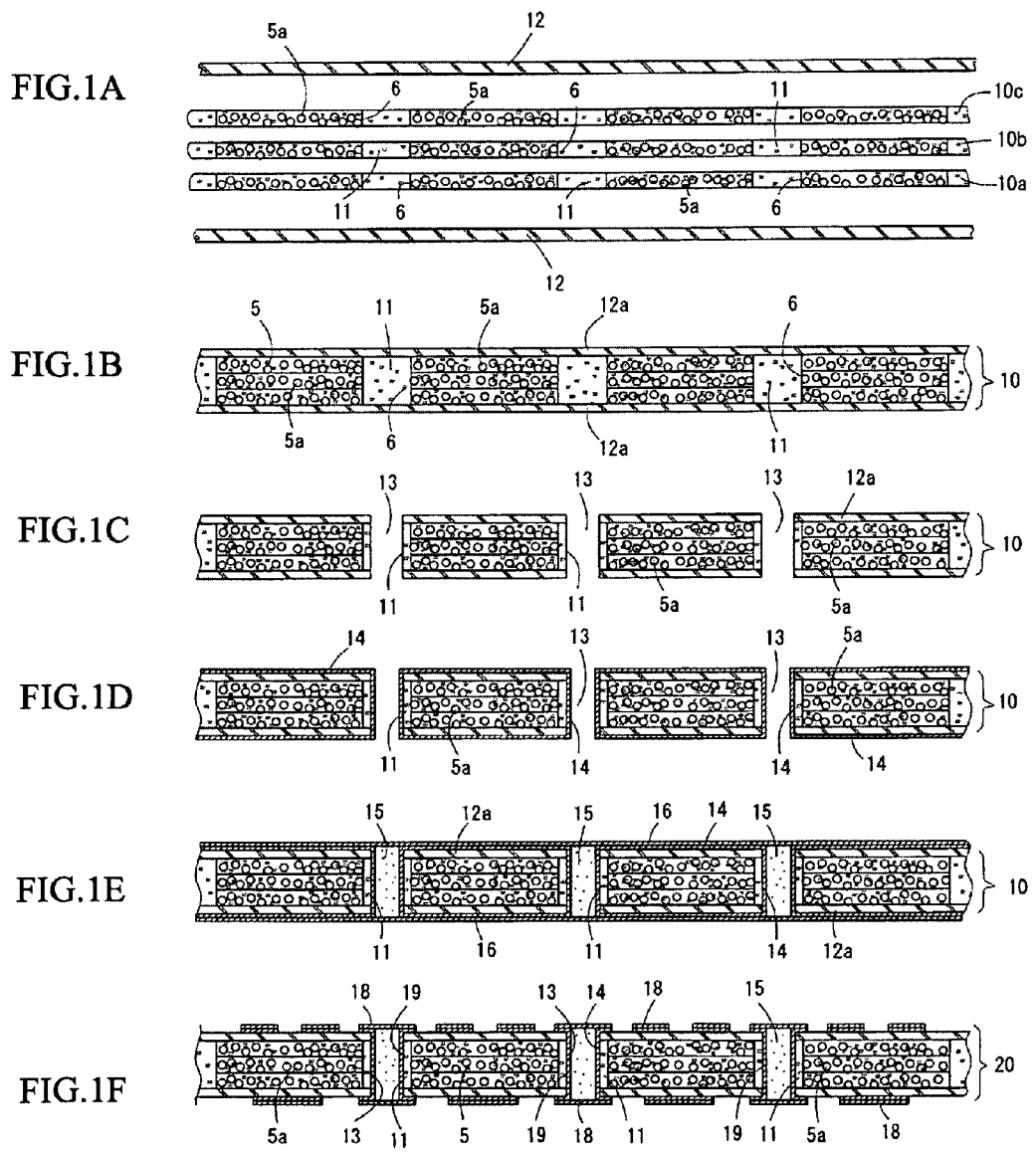
FIGS. 1A to 1F are cross-sectional views showing manufacturing steps of a core substrate.

FIG. 1A shows a state where prepregs 10a, 10b, and 10c that include carbon fiber and electrically insulating prepregs 12 that include a filler such as alumina or silica to adjust the thermal expansion coefficient have been positioned relative to one another in readiness for thermocompression bonding.

Although three prepregs 10a, 10b, and 10c are placed on top of each other to form the core portion 10 in the present embodiment, the number of prepregs used to construct the core portion 10 may be selected as appropriate according to the desired thickness of the circuit board, core substrate strength, or the like.

The most characteristic feature of this method of manufacturing a circuit board according to the present invention is the construction of the prepregs 10a, 10b, and 10c that include carbon fiber and are used to construct the core portion 10. In more detail, the prepregs 10a, 10b, and 10c are constructed of a woven material that uses long carbon fibers and such carbon fiber woven material is impregnated with epoxy resin to produce a semi-hardened state with some degree of adhesion.

The characteristic construction of the prepregs 10a, 10b, and 10c lies in the method of weaving. That is, although fibers are uniformly woven on a plane in a normal woven material, the carbon fiber woven material used in the prepregs 10a, 10b, and 10c according to the present embodiment is woven so as to include spaces at the positions where the PTH will pass through so as to avoid interference between the PTH formed in the core substrate and the carbon fibers 5a.

Figure 2:
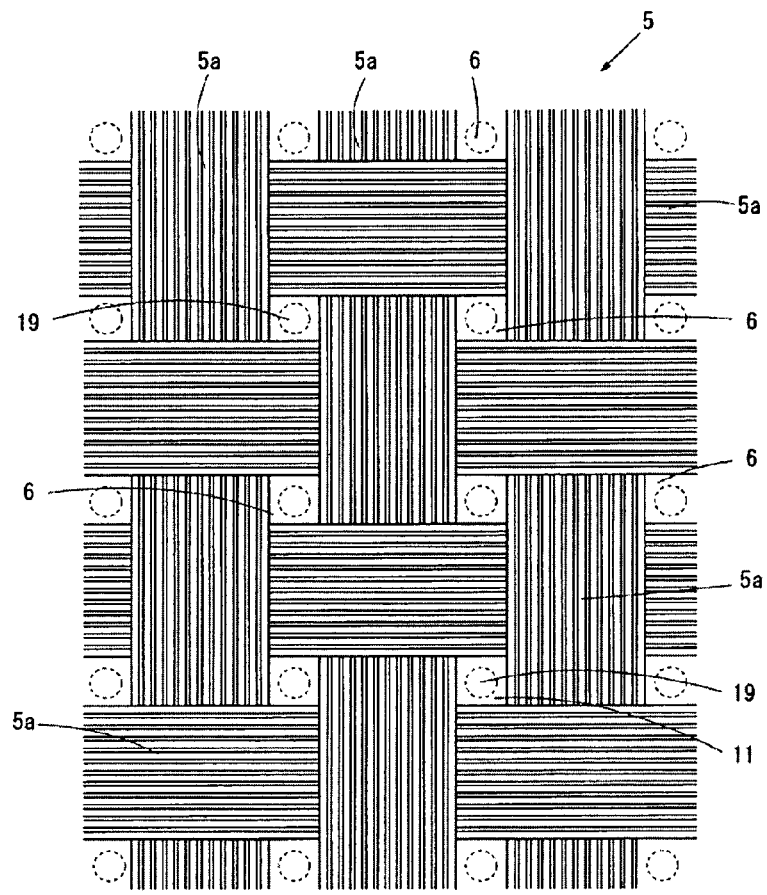
FIG. 2 is a plan view showing the layout of carbon fiber woven material and plated through holes.

FIG. 2 is a plan view of the carbon fiber woven material 5 used in the prepregs 10a, 10b, and 10c. Although the carbon fiber woven material 5 is formed by weaving the carbon fibers 5a into a plain weave, spaces (referred to as "openings" in the present specification) are formed at predetermined intervals so that parts where the fibers are in a plain weave are positioned at predetermined intervals. When the core substrate is formed, the PTH pass through these openings 6. That is, the carbon fiber woven material 5 is woven so that the openings 6 are formed in advance in accordance with the layout of the PTH to be formed in the core substrate.

The planar layout of the PTH to be formed in the core substrate will differ from product to product, but normally the PTH formed in a core substrate are laid out having been aligned horizontally and vertically at predetermined intervals. When the PTH are laid out at predetermined intervals in this way, it is possible to form the carbon fiber woven material 5 so that the openings 6 are formed in accordance with the planar layout of the PTH.

Also, when forming the carbon fiber woven material 5, it is possible to adjust not only the positions of the openings 6 in accordance with the layout of the PTH but also the vertical and horizontal dimensions of the openings 6 through which the PTH will pass.

Single carbon fibers have a diameter of around several μm. Accordingly, it is possible to form a carbon fiber woven material 5 by weaving single carbon fibers as shown in FIG. 2 and also possible to form the carbon fiber woven material 5 using threads produced by twisting together a plurality of single carbon fibers. Twisted threads of carbon fibers have a diameter of around several tens of μm.

Although the layout pitch of the PTH formed in the core substrate will differ from product to product, in the case where PTH are disposed with a layout pitch of around 400 μm on a typical substrate used to mount a semiconductor element, for example, it is easy to form a carbon fiber woven material 5 with openings 6 formed at suitable positions using twisted threads with a diameter of around several tens of μm.

Although the carbon fiber woven material 5 shown in FIG. 2 is woven so that the carbon fibers 5a intersect one another at right angles, it is also possible to form a carbon fiber woven material 5 in which the openings 6 are formed by a weaving method where the carbon fibers 5a intersect at an angle aside from a right angle, such as where the carbon fibers 5a intersect diagonally at 120°. Also, the carbon fiber woven material 5 may be woven so that the openings 6 formed in the carbon fiber woven material 5 are not square in planar form and instead are rectangular, diamond-shaped, hexagonal, octagonal, or the like.

Also, although an example where the carbon fiber woven material 5 is aligned with the openings 6 at predetermined intervals in the vertical and horizontal directions is shown in FIG. 2, when the PTH to be formed in the core substrate are not arranged uniformly and are instead laid out non-uniformly on a plane, the carbon fiber woven material 5 could be conceivably formed so that the openings 6 are formed in accordance with the planar layout of the PTH. The present invention is not limited to a circuit board where the PTH are laid out uniformly and can also be applied to a case where the PTH are laid out non uniformly.

By impregnating the carbon fiber woven material 5 with resin, a prepreg is obtained. Such prepreg is obtained by impregnating the carbon fibers 5a of the carbon fiber woven material 5 with resin to fill the openings 6 with resin 11. Note that when the openings 6 are large, there are cases where the openings 6 will not become filled with resin.

FIG. 1A shows a state where the prepregs 10a, 10b, and 10c obtained in this way have been positioned. When a plurality of prepregs are positioned in this way on top of one another, the prepregs are positioned so that the layout positions of the openings 6 in the carbon fiber woven material 5 match.

During this manufacturing process, large pieces of carbon fiber woven material 5 are prepared, such carbon fiber woven material 5 is impregnated with resin such as epoxy resin to form large prepregs 10a, 10b, 10c and the prepregs 10a, 10b, 10c are used to form the core substrate. FIGS. 1A to 1F show enlargements of parts of large prepregs 10a, 10b, 10c that will be cut out into a large number of products.

FIG. 1B shows a state where the prepregs 10a, 10b, 10c, and 12 have been subjected to thermal compression bonding to form a flat plate. The core portion 10 formed by integrating the prepregs 10a, 10b, and 10c is disposed inside insulating layers 12a that are composed of the prepregs 12. This core portion 10 includes regions that include the carbon fibers 5a and regions composed of the openings 6 in the carbon fiber woven material 5. The regions that include the carbon fibers 5a are regions that conduct electricity and the regions that compose the openings 6 are filled with the resin 11 and are electrically insulating. When the openings 6 in the carbon fiber woven material 5 are not filled with the resin 11 in a prepreg, by carrying out thermal compression bonding with the prepregs 12, the openings 6 will become filled with resin from the prepregs 12.

After the core portion 10 has been integrally formed, through holes 13 are formed so as to be positioned at the regions of the core portion 10 that are filled with the resin 11 (12), or in other words, at the positions of the openings 6 in the carbon fiber woven material 5 (see FIG. 1C). The through holes 13 are formed with a smaller diameter than the openings 6 formed in the carbon fiber woven material 5. By doing so, the resin 11 is exposed to the inner surfaces of the through holes 13. The through holes 13 are formed by drilling, for example.

FIG. 1D shows a state where electroless copper plating and electro copper plating have been carried out on the core portion 10 to form a conductive layer 14 on the inner surfaces of the through holes 13 and the surface of the core portion 10 to form the PTH. Since the inner surfaces of the through holes 13 are covered with the resin 11 and the insulating layers 12a, even if the inner surfaces of the through holes 13 are covered with the conductive layer 14, there will be no electrical shorting between the conductive layer 14 and the regions of the core portion 10 that include the (electrically conductive) carbon fibers 5a.

FIG. 1E shows a state where conductive layers 16 have been formed on both surfaces of the core portion 10 after the through holes 13 have been filled with resin 15. The conductive layers 16 can be formed by plating.

FIG. 1F shows a state where wiring patterns 18 have been formed on both surfaces of the substrate by etching the conductive layers 16 and 14 into predetermined patterns, thereby forming a core substrate 20. The conductive layer 14 formed on the inner surfaces of the through holes 13 forms PTH 19 that electrically connect the wiring patterns formed on both surfaces of the core substrate 20.

The PTH 19 are disposed so as to pass through the through holes 13 formed in the core portion 10 and since the inner surfaces of the through holes 13 are covered with an electrically insulating resin, short circuiting between the PTH 19 and the conductive portions of the core portion 10, that is, the regions that include the carbon fibers 5a is prevented.

In this way, with the method of manufacturing a core substrate according to the present embodiment, by providing the openings 6 through which the PTH 19 pass in the carbon fiber woven material 5 that constructs the core portion 10, when the PTH 19 are provided in the core substrate 20, the conduction of electricity between the PTH 19 and the carbon fiber woven material 5 is avoided and therefore short circuits between the PTH 19 and the core portion 10 are avoided.

Also, the through holes 13 that form the PTH 19 are merely provided in the core portion 10 of the core substrate 20, so that unlike a conventional core substrate, there is no need to provide preliminary holes for passing the PTH through the substrate. By doing so, the layout pitch of the PTH 19 formed in the core substrate 20 can be made narrower than on a conventional core substrate and the PTH 19 can be formed with a higher density.

Since the through holes 13 formed in the core portion 10 have a smaller diameter than on a conventional substrate, even if the through holes 13 are filled with the resin 15, compared to the case where preliminary holes are filled with resin as in a conventional substrate, there is a reduction in the amount of resin used to fill the holes, which is effective in suppressing a rise in the thermal expansion coefficient of the core substrate.

Circuit Board

Figure 3:
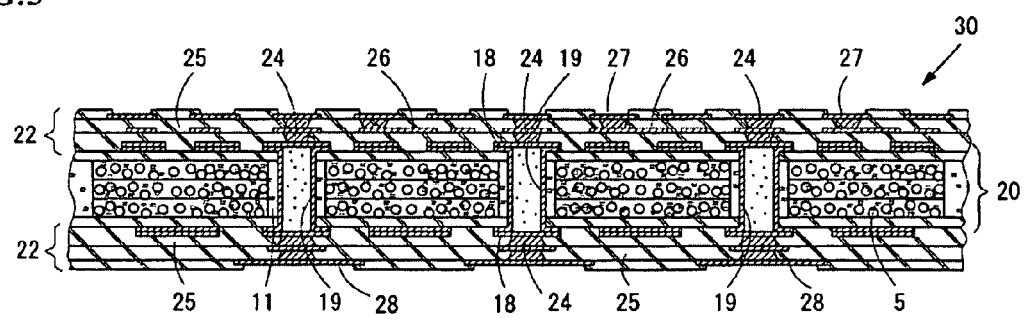
FIG. 3 is a cross-sectional view of a circuit board.

FIG. 3 shows a state where wiring layers 22 have been laminated on both surfaces of the core substrate 20 to form a circuit board 30. The wiring layers 22 are formed so that wiring patterns 26 are electrically connected by via holes 24 with insulating layers 25 in between. The wiring patterns 26 formed on the wiring layers 22 on both surfaces of the circuit board 30 are electrically connected via the PTH 19 formed in the core substrate 20.

The wiring layers 22 can be formed by a method such as building up. Pads 27 for connecting a semiconductor element are formed on a surface of the circuit board 30 onto which a semiconductor element is to be mounted. Lands 28 to which external connection terminals such as solder balls are bonded are formed on the other surface of the circuit board 30.

Figure 4:
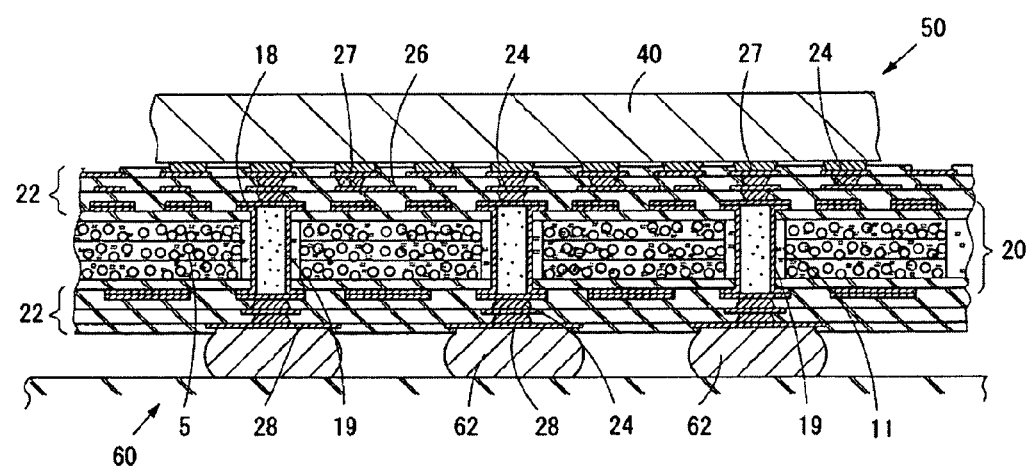
FIG. 4 is a cross-sectional view of a state where a semiconductor device is mounted.

FIG. 4 shows a state where a semiconductor device 50, which is constructed by mounting a semiconductor element 40 on the circuit board 30, has been mounted on a mounting substrate 60. The semiconductor element 40 is provided on the circuit board 30 by flip-chip bonding. The semiconductor device 50 is mounted on the mounting substrate 60 by joining solder balls 62 to the lands 28.

The semiconductor element 40 and the mounting substrate 60 are electrically connected via the PTH 19 formed in the circuit board 30, the wiring patterns 18, 26 formed on the wiring layers 22, the via holes 24, and the like.

As described earlier, since the PTH 19 formed in the circuit board 30 are formed after providing the through holes 13 for forming the PTH 19 in the core substrate 20, the PTH 19 can be disposed with a fine pitch of 400 μm, for example, which is suited to mounting a semiconductor element where the electrodes are disposed at a fine pitch.

According to the circuit board 30 and the semiconductor device 50 according to the present embodiment, by using the carbon fiber woven material 5 that has a low thermal expansion coefficient in the core substrate 20, it is possible to match the thermal expansion coefficient of the circuit board 30 with the thermal expansion coefficient of the semiconductor element 40. The thermal expansion coefficient of carbon fibers is around 1 ppm/° C. and the thermal expansion coefficient of silicon that constructs the semiconductor element 40 is around 3 ppm/° C. Accordingly, by mixing filler into the prepregs that include carbon fibers and construct the core portion 10 and/or adjusting the thermal expansion coefficient of the insulating layers 25 used in the wiring layers 22, it is possible to make the overall thermal expansion coefficient of the circuit board 30 match the thermal expansion coefficient of the semiconductor element 40.

In this way, by matching the thermal expansion coefficient of the circuit board 30 and the thermal expansion coefficient of the semiconductor element 40, it is possible to alleviate the thermal stresses that are produced between the semiconductor element 40 and the circuit board 30 during a heat treatment or a mounting operation during the manufacturing process and thereby provide a highly reliable circuit board 30 and semiconductor device 50.

Note that although the core portion 10 of the core substrate 20 is formed using the carbon fiber woven material 5 in the embodiment described above, it is also possible to form the material that constructs the core portion 10 by forming a composite material where the carbon fibers 5a are woven with other fibers.

Although an example where the semiconductor device 50, which is produced by mounting the semiconductor element 40 on the circuit board 30, is mounted on the mounting substrate 60 has been described in the above embodiment, it is also possible to use a construction where a semiconductor device, which is constructed with the semiconductor element 40 provided on another circuit board with the circuit board 30 in between as an interposer, is mounted on the mounting substrate 60.

Figure 5:
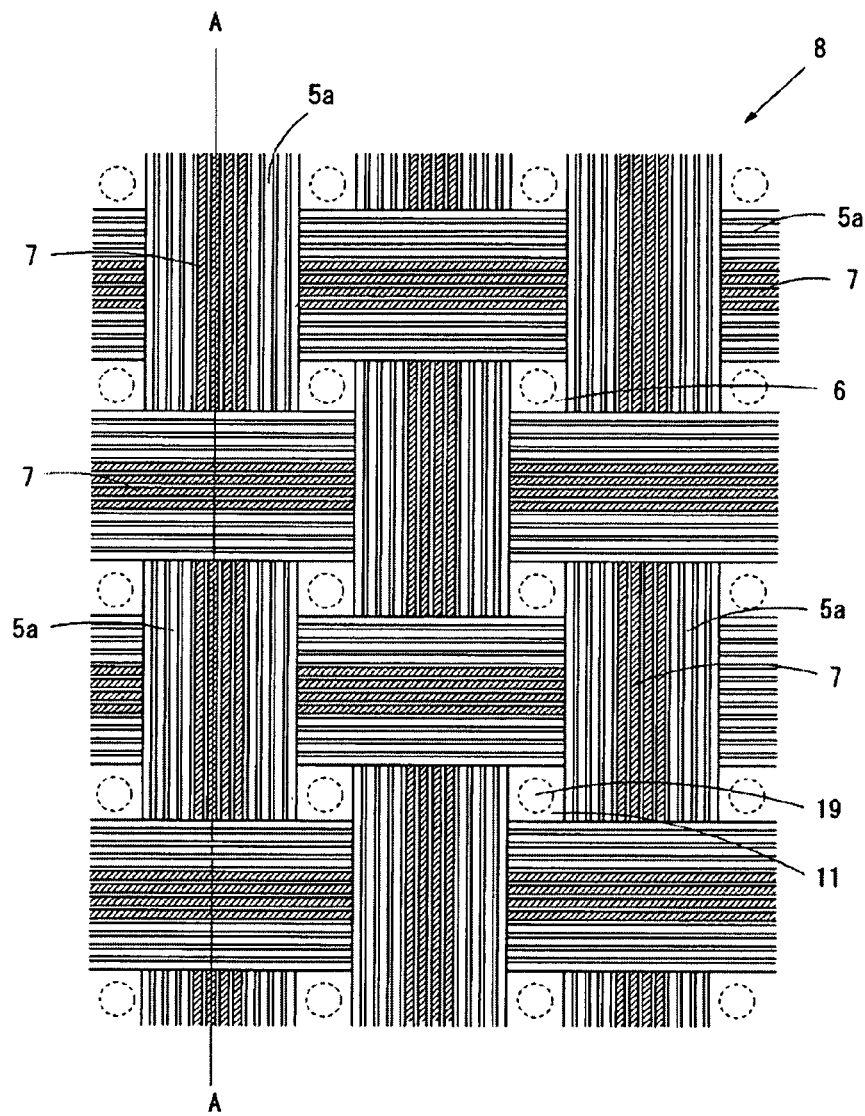
FIG. 5 is a plan view showing one example of a woven material that constructs a core portion.

FIG. 5 is a plan view of a composite weave material 8 produced by weaving the carbon fibers 5a and aramid fibers 7 in the carbon fiber woven material 5 shown in FIG. 2. This material 8 is woven so that the openings 6 are formed in accordance with the layout of the PTH 19 to be formed in the core substrate 20. The aramid fibers 7 have a thermal expansion coefficient of 2 to 3 ppm/° C. which is lower than that of silicon, and can be favorably used as fibers for constructing the material 8. It should be obvious that resin fibers aside from aramid fibers, non-conductive fibers such as ceramic fibers, and conductive fibers may also be used.

When this material 8 is used, the material 8 is immersed in resin such as epoxy resin, to impregnate the material 8 with resin to form a prepreg. The method of forming a core substrate using prepregs formed using the material 8 is exactly the same as the method described above.

This method of using the material 8 that has been composite woven from fibers such as the aramid fibers 7 and the carbon fibers 5a has an advantage in that by adjusting the relative amounts of the carbon fibers 5a and the aramid fibers 7 in the composite, it is possible to adjust the thermal expansion coefficient of the core portion 10.

Also, when a large circuit board is cut out into individual pieces after the formation of the circuit board, as shown in FIG. 5, by cutting at cut positions where the aramid fibers 7 are disposed (as one example the position of the line A-A in FIG. 5), it is possible to expose the aramid fibers 7 at the cut end surface of the circuit board and thereby limit the parts where the carbon fibers 5a become exposed. This means it is possible to avoid problems where the carbon fibers 5a become detached from the outer side surfaces of the circuit boards that have been cut out or where the carbon fibers 5a exposed at the side surfaces of the circuit boards contact other electronic components and shorting occurs.

Note that when a composite material of carbon fibers and other fibers is used, the fibers used in combination with the carbon fibers are not limited to one type of fibers. It is also possible to produce a material where carbon fibers and two or more types of fibers are combined or to use another type of conductive fibers in place of the carbon fibers.

Also, although the carbon fiber woven material 5 is used in the core portion 10 in the embodiment described above, the present invention is not limited to using woven material and it is also possible to use non-woven material.

In addition, the present invention can also be applied when conductive fibers aside from carbon fibers, or non-conductive fibers such as ceramic fibers, ceramic filler, or the like are used in the core portion that constructs the core substrate 20. That is, fibers with a lower thermal expansion coefficient than copper or a semiconductor element to be mounted on a circuit board may be used to produce a core substrate with a predetermined strength so that the core substrate can reinforce the circuit board and with a thermal expansion coefficient that is not greatly different to the thermal expansion coefficient of the semiconductor element. Accordingly, by using such material (fibers) to adjust the strength or the thermal expansion coefficient of the core substrate and disposing the fibers at positions that do not interfere with the positions passed through by the PTH, it is possible to form the core substrate or circuit board in exactly the same way as the embodiment described above.

What is claimed is:

1. A method of manufacturing a circuit board, comprising:
a step of forming a core portion by thermal compression bonding prepregs formed by disposing fibers so as to produce openings at positions where plated through holes will pass through and impregnating the fibers with resin;
a step of forming through holes that pass inside the openings at positions of the openings in the core portion; and
a step of forming a conductive layer on inner surfaces of the through holes to form plated through holes at positions that do not interfere with the fibers and thereby produce a core substrate.

2. A method of manufacturing a circuit board according to claim 1,
further comprising a step of laminating wiring layers on both surfaces of the core substrate.

3. A method of manufacturing a circuit board according to claim 1,
wherein in the step of forming the core portion, a plurality of prepregs are positioned with the openings aligned relative to one another and subjected to thermal compression bonding.

4. A method of manufacturing a circuit board according to claim 1,
wherein in the step of forming the core portion, the fibers are formed as a carbon fiber woven material, and prepregs where openings through which the plated through holes will pass are formed in the carbon fiber woven material are used.

5. A method of manufacturing a circuit board according to claim 1,
wherein in the step of forming the core portion, the fibers are formed as a woven material that is a composite of carbon fibers and non-conductive fibers, and prepregs where openings through which the plated through holes will pass are formed in the woven material are used.

* * * * *